United States Patent
Holmberg et al.

(10) Patent No.: US 6,263,564 B1
(45) Date of Patent: Jul. 24, 2001

(54) METHOD OF PRODUCING A PRINTED BOARD ASSEMBLY AND A SHIELDING ELEMENT FOR SHIELDING COMPONENTS ON A PRINTED BOARD ASSEMBLY

(75) Inventors: Per Holmberg, Dalby; Tommy Sandevi, Malmö; Daniel Friman, Mölndal, all of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/221,519

(22) Filed: Dec. 28, 1998

(30) Foreign Application Priority Data

Dec. 29, 1997 (SE) ...................................... 9704894

(51) Int. Cl.[7] .................................................. H05K 3/34
(52) U.S. Cl. ................................................. 29/840; 29/832
(58) Field of Search .............................. 29/832, 840, 833, 29/825, 843, 841; 174/35 R

(56) References Cited

U.S. PATENT DOCUMENTS

| 4,125,307 | * | 11/1978 | Thayer . |
| 4,157,007 | * | 6/1979 | Vennard . |
| 4,714,905 | * | 12/1987 | Berstein et al. . |
| 4,945,633 | * | 8/1990 | Hakanen et al. . |
| 5,084,961 | * | 2/1992 | Yoshikawa . |
| 5,332,829 | * | 7/1994 | Hagiwara . |
| 5,477,419 | * | 12/1995 | Goodman et al. . |
| 5,545,281 | * | 8/1996 | Matsui et al. . |
| 5,761,053 | * | 6/1998 | King et al. . |
| 5,763,824 | * | 6/1998 | King et al. . |
| 5,975,408 | * | 11/1999 | Goossen . |
| 6,090,728 | * | 7/2000 | Yenni, Jr. et al. . |

FOREIGN PATENT DOCUMENTS

| 0 654 962 | 5/1995 | (EP) . |
| 2 261 324 | 5/1993 | (GB) . |

* cited by examiner

*Primary Examiner*—Carl J. Arbes
(74) *Attorney, Agent, or Firm*—Burns, Doane, Swecker & Mathis, L.L.P.

(57) ABSTRACT

In a method of producing a printed board assembly from a printed board, components are furnace soldered to the printed board. A string of heat curing, electrically conductive material, elastic after curing, is deposited around the site where the components to be shielded, are to be furnace soldered. That string is cured into a shielding gasket in the furnace soldering step, i.e. in the same production step as the components are furnace soldered to the printed board. The shielding gasket is adapted to cooperate with a shielding housing to shield the components.

5 Claims, 1 Drawing Sheet

METHOD OF PRODUCING A PRINTED BOARD ASSEMBLY AND A SHIELDING ELEMENT FOR SHIELDING COMPONENTS ON A PRINTED BOARD ASSEMBLY

This application claims priority under 35 U.S.C. §§ 119 and/or 365 to 9704894-6 filed in Sweden on Dec. 29, 1997; the entire content of which is hereby incorporated by reference.

The invention relates, generally, to shielding of components on printed board assemblies and, more specifically, to a method of producing a printed board assembly having shielding means as well as to a shielding element cooperating with shielding means on a printed board assembly for electrically shielding components on the printed board assembly.

BACKGROUND

From GB-2 261 324-A, it is known to shield a printed board assembly by applying a shielding material to a conductor on a printed board and, then, depending on the shielding material, harden it, e.g. by means of UV light. The shielding material on the printed board is intended to cooperate with a shielding housing that may be provided with grooves or other recesses to improve the seal and the contact with the shielding material on the printed board.

Applying shielding material to a printed board assembly already produced, requires an additional production step as does hardening of the shielding material in a separate production step.

Thus, a printed board assembly in accordance with said GB-2 261 324-A will be quite expensive to produce.

SUMMARY

The object of the invention is to bring about a method of producing printed board assemblies having shielding means, which is cheaper and simpler than the methods known so far.

This is attained by the method according to the invention in that, before the components are soldered to conductors on the printed board in a furnace soldering step, a string of a heat curing, electrically conductive material is deposited around the site where at least one component to be electrically shielded, is to be furnace soldered to the printed board, and that said string is cured in the same step as the components are furnace soldered to the conductors on the printed board to form a shielding gasket.

Hereby, great savings in production costs will be made in that the curing and the soldering are carried out in the same process step instead of in two separate process steps.

BRIEF DESCRIPTION OF THE DRAWINGS

The invention will be described more detail below with reference to the appended drawing, on which

DETAILED DESCRIPTION

Figure 1:
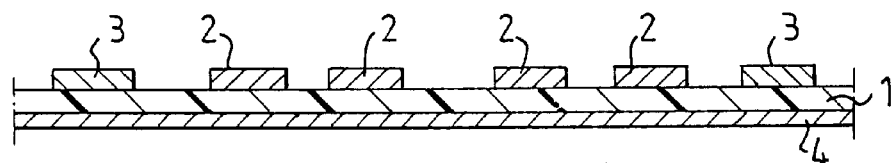
FIGS. 1–4 illustrate different stages of the method according to the invention of producing a printed board assembly.

FIG. 1 is a partial cross-sectional view of an embodiment of a printed board 1 having, on its one side, a pattern of conductors 2 and a conductor 3 surrounding the conductors 2, and, on its other side, a layer 4 of conductive material. The conductors 2 and 3 as well as the layer 4 are normally of copper. The conductor 3 is not necessary in the general case, but is preferred.

In the embodiment illustrated in FIG. 1, components that need to be shielded are supposed to be soldered to the conductors 2, while the conductors 3 are supposed to be provided with a shielding gasket.

Figure 2:
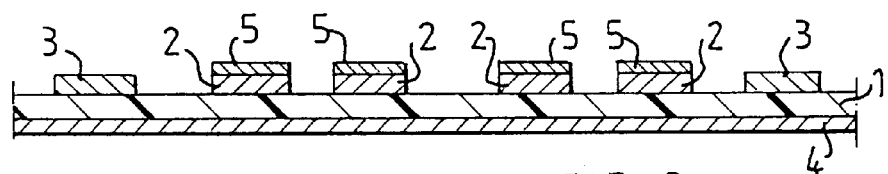

In FIG. 2, the conductors 2 on the printed board 1 have been provided with a layer 5 of solder at the sites where electric components to be shielded, are to be soldered to the conductors 2.

Figure 3:
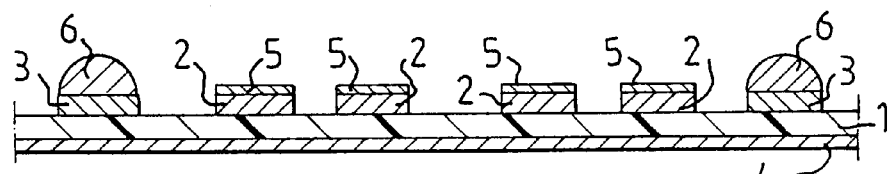

In FIG. 3, a string 6 of heat curing, electrically conductive material, elastic after curing, has been deposited on the conductor 3 surrounding the conductors 2 provided with the solder layer 5 on the printed board 1.

Figure 4:
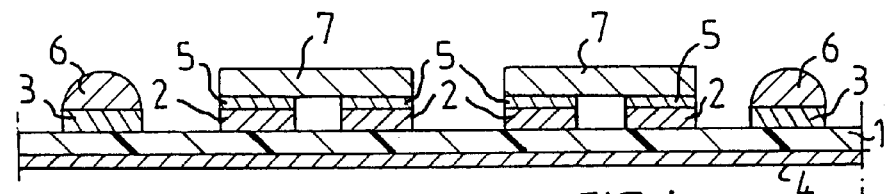

In FIG. 4, two components 7 to be shielded, have been placed on the solder layers 5 to be soldered to the conductors 2.

In this connection, it should be pointed out that, as an alternative, the components 7 may equally well be placed on the solder layers 5 before the string 6 is deposited on the conductor 3 on the printed board 1.

The printed board 1 as apparent from FIG. 4, is then introduced into a solder furnace in order for the components 7 to be furnace soldered to the conductors 2, and for the string 6 of heat curing material to be cured in one and the same step to transform the latter into an elastic shielding gasket.

Figure 5:
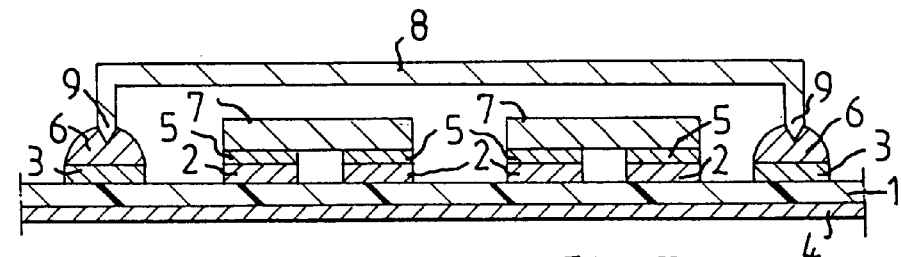
FIG. 5 is a sectional view of the printed board assembly in FIG. 4, provided with a shielding element in accordance with the invention.

In FIG. 5, the complete printed board assembly with the cured string or shielding gasket 6, has been provided with a shielding element 8 in accordance with the invention for electrically shielding the components 7 in combination with the shielding gasket 6 and the conductive layer 4 on the printed board 1.

As apparent from FIG. 5, the shielding element 8 according to the invention is provided with a compartment for receiving the components 7. The rim 9 of the shielding element 8 is adapted to cooperate with the elastic, electrically conductive shielding gasket 6. To this end, the rim 9, in accordance with the invention, is pointed as apparent from FIG. 5. The rim 9 may be shaped like a knife edge or have a sawtooth-shape or any other pointed shape.

It is to be understood that the shielding element 8, of course, may have more than one compartment. The shielding element 8 is either of electrically conductive material or of an insulating material clad with a layer of conductive material. By combining the step of soldering the components to the printed board and the step of curing the shielding gasket deposited on the printed board, the production costs for the complete printed board assemblies will be reduced.

What is claimed is:

1. A method of producing a printed board assembly from a printed board, comprising the steps of depositing solder on conductors on the printed board at spots where electric components are to be soldered to the conductors, placing said components at said spots, and furnace soldering said components to the conductors, wherein a string of heat curing, electrically conductive material which is elastic after curing, is deposited around the site where at least one component to be shielded, is to be furnace soldered, and said string is cured in the same process step as the furnace soldering step of said at least one component to be shielded, to transform it into an elastic shielding gasket which is intended to cooperate with a shielding element to shield said at least one component.

2. The method of claim 1, wherein said string is deposited on a conductor at said site.

3. The method of claim 1, wherein the shielding element has at least one compartment having a rim, the rim of the at least one compartment being adapted to cooperate with the elastic shielding gasket deposited on the printed board assembly around the site of the at least one component to be shielded, and the rim having a pointed shape.

4. The method of claim 3, wherein the rim is shaped like a knife edge.

5. A method of producing a printed board assembly from a printed board, comprising the steps of:

depositing solder on conductors on the printed board at sites where electronic components are to be soldered to the conductors;

placing the electronic components at the sites;

depositing a string of heat curing, electrically conductive material that is elastic after curing around a site where at least one component to be shielded is placed; and furnace soldering the components to the conductors;

wherein the string is cured in the same process step as the furnace soldering of the components, thereby transforming the string into an elastic shielding gasket that cooperates with a shielding element to shield the at least one component; and the shielding element has at least one compartment having a rim, and the rim of the at least one compartment has a pointed shape and is adapted to cooperate with the elastic shielding gasket deposited on the printed board assembly around the site of the at least one component to be shielded such that the rim penetrates the elastic shielding gasket.

* * * * *